(12) United States Patent
Wang et al.

(10) Patent No.: US 7,474,159 B2
(45) Date of Patent: Jan. 6, 2009

(54) FREQUENCY CALIBRATION FOR FREQUENCY SYNTHESIZERS

(75) Inventors: Stanley Wang, Cupertino, CA (US);
Thomas H. Lee, Burlingame, CA (US)

(73) Assignee: ZeroG Wireless, Inc., Sunnyvale, CA (US)

( * ) Notice: Subject to any disclaimer, the term of this patent is extended or adjusted under 35 U.S.C. 154(b) by 128 days.

(21) Appl. No.: 11/801,218

(22) Filed: May 8, 2007

(65) Prior Publication Data

US 2008/0278244 A1 Nov. 13, 2008

(51) Int. Cl.
*H03L 7/00* (2006.01)
(52) U.S. Cl. .................. 331/16; 331/34; 331/177 R; 331/177 V; 331/36 C
(58) Field of Classification Search .................. 331/34, 331/177 R, 16, 177 V, 36 C
See application file for complete search history.

(56) References Cited

U.S. PATENT DOCUMENTS 7,046,098 B2 * 5/2006 Staszewski .................. 331/158

OTHER PUBLICATIONS

A CMOS Self-Calirating Frequency Synthesizer, IEEE Journal of Solid-State Curcuits, vol. 35, No. 10, Oct. 2000, William B. Wilson, Member, IEEE, Un-Ku Moon, Senior Member, IEEE, Kadaba R. Lakshmikumar, Member, IEEE, and Liang Dai, Student Member IEEE, p. 1437-1444.
A Σ-Δ Fractional -N Frequency Synthesizer Using a Wide-Band Integrated VCO and a Fast AFC Technique for GSM/GPRS/WCDMA Applications, Han-il Lee, Student Member, IEEE, Je-Kwang Cho, Member IEEE, Kun-Seok Lee, Member, IEEE, InChul Hwang, Member, IEEE, Tae-Won Ahn, Member, IEEE, Kyung-Suc Nah, member, IEEE, and Byeong-HaPark, Member, IEEE, IEEE Journal of Solid-State Curcuits, vol. 39, No. 7, Jul. 2004, pp. 1164-1169.
Fast AFC Technique Using a Code Estimation and Binary Search Algorithm for Wideband Frequency Synthesis, Kun-Seok Lee [(1)], Eun-Yung Sung, In-Chul Hwang, and Byeong-Ha Park, (1) Samsung Electronics Yongin, Kyounggi-do, 449-711, Korea, k.s. lee@samsung.com, Proceedings of ESSCIRC, Grenoble, France, 2005, pp. 181-184.
CMOS PLL Calibration Techniques, The Chip, Adem Aktas and Mohammed Ismail, IEEE Circuits and Devices Magazine, Sep./Oct. 2004, pp. 6-11.
A 10Mw, 4GHz CMOS Phase-Locked Loop With Dual-Mode Tuning Technique and Partly-Integrated Loop Filter, Georg Konstanznig and Robert Weigel, Institute for Communications and Information Engineering, Johannes Kepler University of Linz, Austria, Institute for Electronics Engineering Friedrich-Alexander-University Erlangen-Nuremberg, 2003 IEEE Radio Frequency Integrated Circuits Symposium, pp. 189-192.

* cited by examiner

*Primary Examiner*—Arnold Kinkead
(74) *Attorney, Agent, or Firm*—The Mueller Law Office, P.C.

(57) ABSTRACT

A calibration circuit (17) for calibrating a frequency synthesizer (10) having a voltage-controlled oscillator (VCO) (15) with a plurality of switched-capacitor arrays (CA1-CAn). The calibration circuit (17) counts a predetermined number of periods of the reference-clock signal (ref_clk) and divide-clock signal (div_clk) of the frequency synthesizer using a fast clock signal (fastclk). The fast-clock signal (fastclk) has a frequency greater than either the reference-clock signal (ref_clk) or the divide-clock signal (div_clk), enabling significantly faster calibration of the frequency synthesizer (10) than would be possible using the reference-clock signal (ref_clk). The calibration circuit (17) compares the count of the periods of the reference-clock signal (ref_clk) and the divide-clock signal (div_clk) and varies the tank signal of the VCO (VCO_tank_setting) until the count of the periods is substantially equal.

19 Claims, 3 Drawing Sheets

US 7,474,159 B2

FREQUENCY CALIBRATION FOR FREQUENCY SYNTHESIZERS

FIELD OF THE INVENTION

The invention relates generally to the frequency calibration of frequency synthesizers, and more specifically to the frequency calibration of frequency synthesizers having a voltage-controlled oscillator (VCO) with switched-capacitor arrays.

BACKGROUND OF THE INVENTION

Frequency synthesizers have a wide range of applications, including wide-band communications systems and information-processing systems. One of the elements of a frequency synthesizer is a voltage-controlled oscillator (VCO). A commonly used VCO is an inductive-capacitive (LC) VCO. In order to meet the requirements of modern wide-band frequency synthesizers, it has traditionally been necessary to utilize VCOs with large gains (Hz/V). However, chip integration has now increased to the point that VCOs with large gains often suffer from noise coupled through the voltage supply and substrate. In an effort to avoid this problem, prior art systems have begun to utilized VCOs with lower gains and with switched-capacitor banks that can be switched on and off to cover a wide range of frequencies.

Due to variations in the operating frequency, voltage, temperature and processing of a VCO, it is necessary to calibrate the switched-capacitor bank for a given required operating frequency. Prior art systems for calibrating switched-capacitor banks generally compare the reference-clock signal and the divided-clock signal of the frequency synthesizer by counting the duration of these signals with reference to the reference-clock signal. This comparison indicates which clock signal is running fastest. In order to perform an accurate comparison, the two clock signals must be compared over a large number of periods. As a result, prior-art calibration systems require a relatively long time to calibrate a frequency synthesizer.

SUMMARY OF THE INVENTION

In one aspect of the invention, a method is provided for calibrating a frequency synthesizer having a voltage-controlled oscillator with a plurality of switched-capacitor arrays. The method comprises the steps of (a) counting a predetermined number of periods of a reference-clock signal and a divided-clock signal of the frequency synthesizer using a fast-clock signal, the fast-clock signal having a frequency greater than the reference-clock signal and the divided-clock signal; (b) comparing the counts of the periods of the reference-clock signal and the divided-clock signal; and (c) varying a tank signal for controlling the plurality of switched-capacitor arrays of the voltage-controlled oscillator until the count of the periods is substantially equal.

In another aspect of the invention, a calibration circuit is provided for calibrating a frequency synthesizer having a voltage-controlled oscillator with a plurality of switched-capacitor arrays. The calibration circuit includes (a) means for counting a predetermined number of periods of a reference-clock signal and a divided-clock signal of the frequency synthesizer using a fast-clock signal, the fast-clock signal having a frequency greater than the reference-clock signal and the divided-clock signal; (b) means for comparing the count of the periods of the reference-clock signal and the divided-clock signal; and (c) means for varying a tank signal for controlling the plurality of switched-capacitor arrays of the voltage-controlled oscillator until the count of the periods is substantially equal.

In another aspect of the invention, an information-processing system is provided. The information-processing system includes (a) a frequency synthesizer including a voltage-controlled oscillator having a plurality of switched-capacitor arrays; and (b) a calibration circuit for (i) counting a predetermined number of periods of a reference-clock signal and a divided-clock signal of the frequency synthesizer using a fast-clock signal, the fast-clock signal having a frequency greater than the reference-clock signal and the divided-clock signal; (ii) comparing the count of the periods of the reference-clock signal and the divided-clock signal; and (iii) varying a tank signal for controlling the plurality of switched-capacitor arrays of the voltage-controlled oscillator until the count of the periods is substantially equal.

DETAILED DESCRIPTION

Reference now will be made in detail to embodiments of the disclosed invention, one or more examples of which are illustrated in the accompanying drawings. Each example is provided by way of explanation of the present technology, not limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

Figure 1:
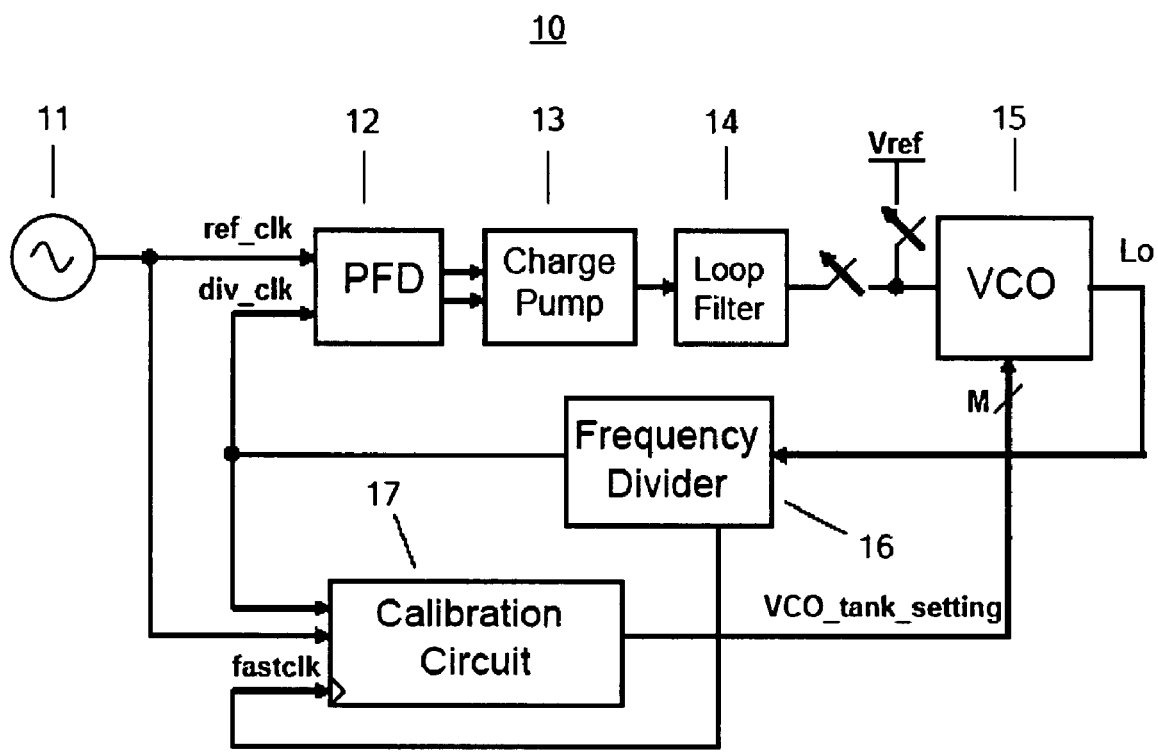
FIG. 1 illustrates an exemplary embodiment of a frequency synthesizer and calibration circuit that is consistent with the present invention.

FIG. 1 illustrates a block diagram of an exemplary embodiment of a frequency synthesizer 10 that is consistent with the present invention. The frequency synthesizer 10 includes a phase-frequency detector (PFD) 12, a charge pump 13, a loop filter 14, a voltage-controlled oscillator (VCO) 15 and a frequency divider 16. These elements are connected in a feedback loop as illustrated in FIG. 1. In one embodiment, the loop filter 14 and VCO 15 are located on the chip as shown in FIG. 1. In other embodiments, the loop filter may be on or off the chip and the VCO may be located on or off the chip. The frequency synthesizer 10 receives a low-frequency reference-clock signal (ref_clk) from a stable, low-frequency oscillator 11. The reference-clock signal is converted by the VCO 15 into a stable, high-frequency local oscillator (LO) signal at the output of the VCO 15. This output signal is divided in frequency by a frequency divider 16, and the resulting divided-clock signal (div_clk) is provided as feedback to the PFD 12, charge pump 13 and loop filter 14. Frequency divider 16, or a portion of the frequency divider, may be located on (as shown) or off the chip.

The frequency synthesizer 10 of the present invention also includes a calibration circuit 17 for calibrating the VCO 15 when the frequency synthesizer 10 is initially turned on or when the settings of the switched-capacitor arrays in the VCO 15 are changed. The calibration circuit 17 receives as inputs the clock signals ref_clk, div_clk and fastclk. The fastclk signal has a frequency that is much greater than that of the ref_clk and div_clk signals. The fastclk signal is a clock signal that is used for counting the periods of the ref_clk and div_clk signals. Fastclk may be generated, for example, by the frequency divider 16. The frequency divider 16 has a divide ratio that is equal to the frequency of the LO signal divided by the frequency of the div_clk signal (fLO/fdiv_clk). The frequency division of the LO signal takes several stages of frequency division, and signals with intermediate frequencies are generated in the frequency divider 16. The fastclk signal may be conveniently derived from one of these signals. Of course, the fastclk signal may also be generated independent of the frequency divider 16 or the frequency synthesizer 10.

The calibration circuit 17 generates a VCO_tank_setting signal as an output. The VCO_tank_setting signal may be an M-bit binary signal for setting the value of the switched-capacitor arrays in the VCO 15. The VCO_tank_setting signal may also be a digital signal, binary signal, 2's complement, linear code signal, gray code signal or the like. Automatic calibration of the frequency synthesizer 10 is initiated when the frequency synthesizer 10 is initially turned on or when the frequency-divide ratio of the frequency synthesizer 10 is changed. A change in the frequency-divide ratio may occur, for example, when an associated communication system switches channels. The automatic calibration begins with a break in the connection between the loop filter 14 and the VCO 15. This break may be accomplished, for example, by switches. The input to the VCO 15 is then biased at a predetermined reference voltage (Vref). This reference voltage may be, for example, in the middle of the VCO input tuning range. An example of a suitable Vref is Vdd/2, where Vdd is the supply voltage. The calibration circuit 17 is next enabled and the fastclk signal from the frequency divider 16 is enabled. The calibration circuit 17 then generates the VCO_tank_setting signal for setting the switched-capacitor arrays in the VCO 15. The initial value of the VCO_tank_setting signal may be set, for example, to the median value of the associated control word (<100 . . . 000>). In other words, for a tank signal with M bits, the initial value may correspond to a digital signal in which only the most significant bit is equal to 1. Once an initial tank signal is generated by the calibration circuit 17 and supplied to the VCO 15, the calibration circuit 17 begins comparing ref_clk and div_clk and altering the tank signal until it is determined that ref_clk and div_clk have substantially the same frequency or period. At that point, the tank signal is optimal for calibrating the frequency synthesizer 10. Exemplary steps for determining the optimal tank signal are described in greater detail below with reference to FIG. 3.

Figure 2:
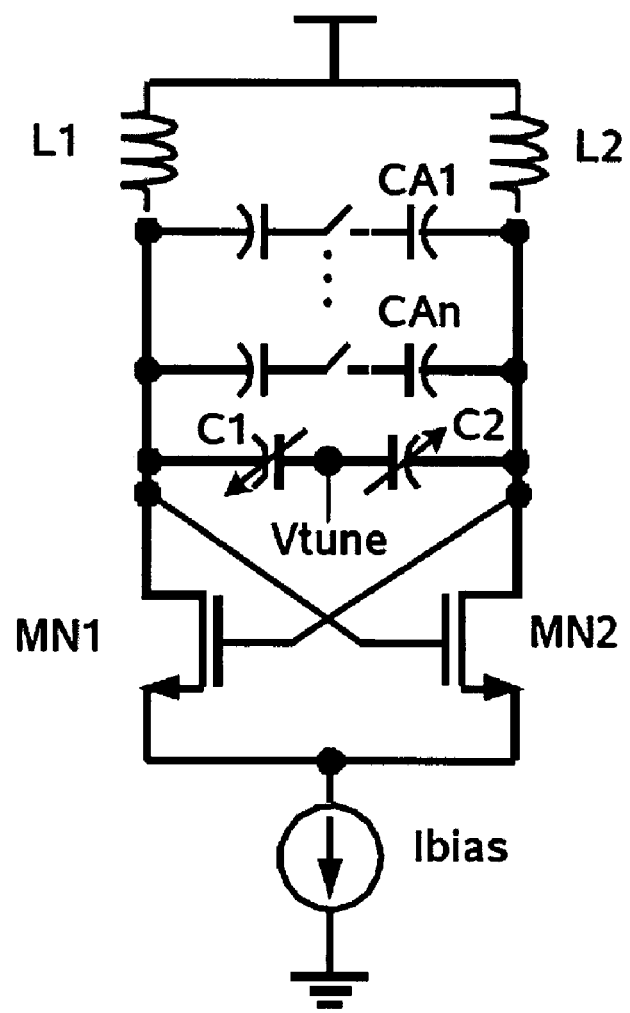
FIG. 2 illustrates a prior art CMOS LC VCO that is suitable for use with the present invention.

FIG. 2 illustrates an example of a prior art VCO 10 that is suitable for use with methods and systems of the present invention. The VCO 10 illustrated is a complementary metal-oxide semiconductor (CMOS) inductive-capacitive (LC) VCO of the type commonly used in frequency synthesizers. The VCO 10 includes a pair of cross-coupled switching transistors (MN1, MN2), inductors (L1, L2), varacters (C1, C2) and a plurality of capacitor arrays (CA1-CAn). The VCO 10 generates two oscillating output signals that are 180 degrees out of phase. The frequency of the oscillating output signals is determined by an applied voltage ($V_{tune}$) and by the values of the inductors, varacters, capacitor arrays, and parasitic capacitance of the transistor devices. Each of the plurality of capacitor arrays may be switched on or off to change the operating frequency of the VCO 10. The VCO 10 illustrated in FIG. 2 is only one example of a VCO configuration that is suitable for use with the present invention.

Figure 3:
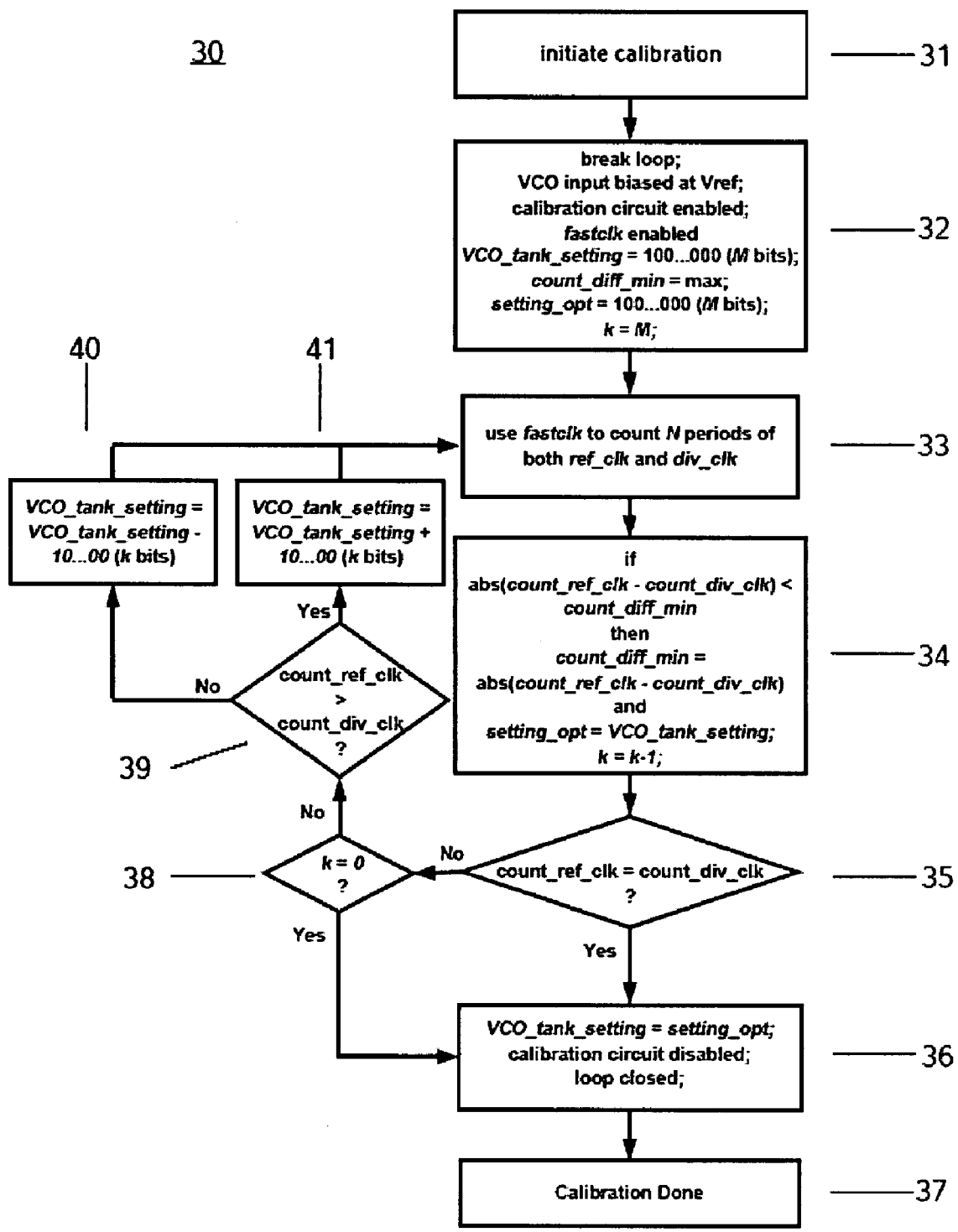
FIG. 3 is a flowchart that illustrates exemplary steps of a method that is consistent with the present invention.

FIG. 3 is a flowchart that illustrates exemplary steps of a calibration method 30 that is consistent with the present invention. For example, the calibration begins at step 31 when (i) the frequency synthesizer is enabled or (ii) an associated communications channel is switched or (iii) a master initiates a slave or (iv) at a manufacture step or the like. In step 32, the loop of the frequency synthesizer is broken at the input of the VCO, and the VCO is biased at the reference voltage Vref. The calibration circuit is also enabled. At this point the calibration circuit receives the fastclk signal from the frequency divider and generates the VCO_tank_setting signal. The initial value of VCO_tank_setting is set to its median value (<100 . . . 000>). The count_diff_min signal is set to its maximum value. The setting_opt signal is set to its median value (<100 . . . 000>). And the counter k is set to M.

In step 33, the fastclk signal is used to count N periods of both the ref_clk and the div_clk signal. The value of N may be varied depending on the desired resolution for the calibration. A larger value of N corresponds to a higher resolution but a longer calibration time. The counting of the N periods may start at either a positive or negative edge of ref_clk and div_clk. In step 34, the absolute difference between the count for ref_clk (count_ref_clk) and the count for div_clk (count_div_clk) is calculated. If the absolute difference is less than the value of count_diff_min, then count_diff_min is set to the value of the absolute difference and the setting_opt signal is set as the value of VCO_tank_setting. Keeping track of count_diff_min along the way, makes it possible to identify the optimal setting at the end of the calibration. In step 33, the counter k is also decremented by one.

In step 35, it is determined whether the count_ref_clk signal is equal to the count_div_clk signal. If it is, the process proceeds to step 36. If it is not, the process proceeds to step 38. In step 38, it is determined whether the counter k equals 0. If it does, the process proceeds to step 36. If it does not, the process proceeds to step 39. In step 39, it is determined whether count_ref_clk is greater than count_div_clk. If it is, the process proceeds to step 41. If it is not, the process proceeds to step 40. In step 40, VCO_tank_setting is set to the value of VCO_tank_setting minus the new median value (<100 . . . 000>). In step 41, VCO_tank_setting is set to the value of VCO_tank_setting plus the new median value (<100 . . . 000>). After either step 40 or step 41 is completed, the process returns to step 33. The process is completed in steps 36 and 37. In step 36, VCO_tank_setting is set to the value of setting_opt, the calibration circuit is disabled, and the loop of the frequency synthesizer is closed. In step 37, the calibration is finished.

Although embodiments of the invention have been discussed primarily with respect to specific embodiments thereof, other variations are possible. For example, various VCO configurations other than the one described in FIG. 2 are suitable for use with the present invention. In addition, steps may be performed by hardware or software, as desired. Note that steps can also be added to, taken from or modified from the steps in this specification without deviating from the scope of the invention. In general, any flowcharts presented are only intended to indicate one possible sequence of basic operations to achieve a function, and many variations are possible. Those of skill in the art will also appreciate that methods and systems consistent with the present invention are suitable for use in a wide range of applications, such as radio-frequency identification (RFID), cellular systems (e.g., TDMA, CDMA, GSM, GPRS, WCDMA and other available standards), other communications systems (e.g., WiFi Systems) and other information-processing systems.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A method of calibrating a frequency synthesizer having a voltage-controlled oscillator with a plurality of switched-capacitor arrays, the method comprising the steps of:
    counting a predetermined number of periods of a reference-clock signal and a divide-clock signal of said frequency synthesizer using a fast-clock signal, said fast-clock signal having a frequency greater than said reference-clock signal and said divide-clock signal;
    comparing said count of said periods of said reference-clock signal and said divide-clock signal; and
    varying a tank signal for controlling said plurality of switched-capacitor arrays of said voltage-controlled oscillator until counts of said periods is substantially equal.

2. The method of claim 1 further including the step of temporarily switching an input of said voltage-controlled oscillator to a predetermined reference voltage prior to said counting of said predetermined number of periods.

3. The method of claim 1 wherein said fast-clock signal has a frequency substantially equal to an output of said voltage-controlled oscillator.

4. The method of claim 1 further comprising the step of setting an initial value of said tank signal to a median value of a control word associated with said tank signal.

5. The method of claim 1 further comprising calibrating said frequency synthesizer using said tank signal corresponding to said counts of said periods being substantially equal.

6. The method of claim 5 wherein said predetermined number of periods is adjustable to vary a resolution of said step of calibration.

7. A calibration circuit for calibrating a frequency synthesizer having a voltage-controlled oscillator with a plurality of switched-capacitor arrays, comprising:
    means for counting a predetermined number of periods of a reference-clock signal and a divide-clock signal of said frequency synthesizer using a fast-clock signal, said fast-clock signal having a frequency greater than said reference-clock signal and said divided-clock signal;
    means for comparing said count of said periods of said reference-clock signal and said divided-clock signal; and
    means for varying a tank signal for controlling said plurality of switched-capacitor arrays of said voltage-controlled oscillator until said count of said periods is substantially equal.

8. The calibration circuit of claim 7 further comprising means for temporarily switching an input of said voltage-controlled oscillator to a predetermined reference voltage.

9. The calibration circuit of claim 7 wherein said fast-clock signal has a frequency substantially equal to an output of said voltage-controlled oscillator.

10. The calibration circuit of claim 7 further comprising means for setting an initial value of said tank signal to a median value of a control word associated with said tank signal.

11. The calibration circuit of claim 7 further comprising means for calibrating said frequency synthesizer using said tank signal corresponding to said counts of said periods being substantially equal.

12. The calibration circuit of claim 11 further comprising means for adjusting said predetermined number of periods to vary a resolution of said calibration circuit.

13. An information-processing system, comprising:
    a frequency synthesizer including a voltage-controlled oscillator having a plurality of switched-capacitor arrays; and
    a calibration circuit for (a) counting a predetermined number of periods of a reference-clock signal and a divided-clock signal of said frequency synthesizer using a fast-clock signal, said fast-clock signal having a frequency greater than said reference-clock signal and said divided-clock signal; (b) comparing said count of said periods of said reference-clock signal and said divided-clock signal; and (c) varying a tank signal for controlling said plurality of switched-capacitor arrays of said voltage-controlled oscillator until said count of said periods is substantially equal.

14. The information-processing system of claim 13 wherein said calibration circuit is configured to temporarily switch an input of said voltage-controlled oscillator to a predetermined reference voltage.

15. The information-processing system of claim 13 wherein said fast-clock signal has a frequency substantially equal to an output of said voltage-controlled oscillator.

16. The information-processing system of claim 13 wherein said calibration circuit is configured to set an initial value of said tank signal to a median value of a control word associated with said tank signal.

17. The information-processing system of claim 13 wherein said calibration circuit is configured to calibrate said frequency synthesizer using said tank signal corresponding to said counts of said periods being substantially equal.

18. The information-processing system of claim 13 wherein said calibration circuit is configured to adjust said predetermined number of periods to vary a resolution of said calibration circuit.

19. The method of claim 13 including the step of storing a minimum difference between said reference-clock signal and said divided-clock signal as a setting_opt signal.

* * * * *